US008855160B2

(12) United States Patent
Adachi et al.

(10) Patent No.: US 8,855,160 B2
(45) Date of Patent: Oct. 7, 2014

(54) HORIZONTAL-CAVITY SURFACE-EMITTING LASER

(75) Inventors: Koichiro Adachi, Musashino (JP);
Yasunobu Matsuoka, Hachioji (JP);
Toshiki Sugawara, Kokubunji (JP);
Kazunori Shinoda, Musashino (JP);
Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 147 days.

(21) Appl. No.: 13/512,595

(22) PCT Filed: Nov. 29, 2010

(86) PCT No.: PCT/JP2010/071207
§ 371 (c)(1),
(2), (4) Date: May 29, 2012

(87) PCT Pub. No.: WO2011/065517
PCT Pub. Date: Jun. 3, 2011

(65) Prior Publication Data
US 2012/0230361 A1    Sep. 13, 2012

(30) Foreign Application Priority Data

Nov. 30, 2009  (JP) ................................ 2009-271678

(51) Int. Cl.
*H01S 5/18*  (2006.01)
*H01S 5/40*  (2006.01)
*H01S 5/022*  (2006.01)
*H01S 5/22*  (2006.01)
*H01S 5/042*  (2006.01)
*H01S 5/12*  (2006.01)
*H01S 5/026*  (2006.01)

(52) U.S. Cl.
CPC ................. *H01S 5/18* (2013.01); *H01S 5/4031* (2013.01); *H01S 5/4025* (2013.01); *H01S 5/0224* (2013.01); *H01S 5/02212* (2013.01); *H01S 5/2224* (2013.01); *H01S 5/0425* (2013.01); *H01S 5/02268* (2013.01); *H01S 5/12* (2013.01); *H01S 5/0267* (2013.01); *H01S 5/02284* (2013.01)
USPC ......................... 372/50.124; 372/36; 372/108

(58) Field of Classification Search
CPC .... H01S 5/0224; H01S 5/0267; H01S 5/0425; H01S 5/12; H01S 5/18; H01S 5/4025; H01S 5/4031
USPC ........................................ 372/36, 50.124, 108
See application file for complete search history.

(56) References Cited

U.S. PATENT DOCUMENTS

2003/0231682 A1* 12/2003 Eitel ............................... 372/45
2006/0291516 A1  12/2006 Aoki
2008/0266638 A1* 10/2008 Shinoda et al. ............... 359/237

FOREIGN PATENT DOCUMENTS

JP          2007-5594 A       1/2007

OTHER PUBLICATIONS

B. Stegmuller et al., "Surface Emitting InGaAsP/InP Distributed Feedback Laser Diode at 1.53 µm with Monolithic Integrated Microlens", IEEE Photonics Technology Letters, vol. 3, No. 9, Sep. 1991, pp. 776-778.
M. Green et al., "Horizontal Cavity Vertically Emitting Lasers with Integrated Monitor Photodiodes" Proc. of SPIE, vol. 6352 (2006), pp. 63520U-1 to 63520U-8.

* cited by examiner

*Primary Examiner* — Julio J Maldonado
*Assistant Examiner* — Michael Carter
(74) *Attorney, Agent, or Firm* — Miles & Stockbridge P.C.

(57) ABSTRACT

Specifically, provided is a horizontal-cavity surface-emitting laser including, on a semiconductor substrate: a cavity structure; a waveguide layer; and a reflecting part, wherein a first electrode provided on the semiconductor substrate along side regions of the cavity structure and the reflecting part and a second electrode provided on the main surface of the cavity structure are provided, the first electrode includes an electrode (1) that is provided around one side region of the reflecting part located in the direction intersecting with the traveling direction of light guided through the waveguide layer and an electrode (2) provided around one side region of the cavity structure and the other side region of the reflecting part that are located in the direction parallel with the traveling direction of light guided through the waveguide layer, and the shape of the electrode (2) has different widths at at least two positions.

9 Claims, 9 Drawing Sheets

HORIZONTAL-CAVITY SURFACE-EMITTING LASER

TECHNICAL FIELD

The present invention relates to a semiconductor laser element used for optical communications, an optical disk, a medical sensor, and the like, and an optical module using the same.

BACKGROUND ART

With the development of information technology, communication traffic through which large-volume data is transmitted and received at high speed using light is beginning to be rapidly prepared. In particular, the volume of data has been significantly increased not only in conventional communication networks (telecommunications), but also in data communications such as Storage Area Network (SAN) and Ethernet (registered trademark) (LAN), and high-speed communications using light have been actively progressed. For example, the communication standard of 100-gigabit Ethernet for transmitting 100-gigabit data is beginning to be designed in the next-generation optical LAN.

Further, the throughput of a recent high-end router used in a backbone system reaches as high as 1 Tbsp, and further expansion of capacity is expected in the future. Along with this, optical interconnections show great promise to efficiently process large-volume data in data transmission between these transmission devices (a few meters to hundreds of meters) or in short-range data transmission in the device (a few centimeters to tens of centimeters). While large-capacity systems using light have been progressed as described above, low-cost technology becomes more important to provide data transmission using these devices at low costs.

With such a background, improvement of high-speed performance and simple and high-density mounting are important issues for a semiconductor optical element transmitting and receiving signals. The reason for this is as follows. With the increased speeds and capacities of systems, an optical element itself will face a physical limit in high speed in the near future.

Therefore, it is necessary to transmit data using signals of plural channels instead of conventional one channel. For example, a configuration of using 40 channels, in each of which data is transmitted and received at 25 Gbps, has been envisioned for the above-described high-end router. Accordingly, a high-speed semiconductor optical element excellent in high density and simple mounting will become one of key devices in large-capacity systems in the future.

The semiconductor laser element that is an optical source for signal transmission is classified into three types depending on combinations of cavity directions (vertical resonance and horizontal resonance) and faces from which laser light is emitted (end-face emitting and surface emitting). The first type is a horizontal-cavity end-face-emitting laser element, the second type is a vertical-cavity surface-emitting laser element, and the third type is a horizontal-cavity surface-emitting laser element.

In the horizontal-cavity end-face-emitting laser of the first type, an optical waveguide is formed in the direction parallel with a surface of a substrate, and laser light is emitted from an end face obtained by dividing the substrate by cleavage. In the laser structure, the length of the cavity can be increased to as long as hundreds of micrometers, and a high output of tens of megawatts can be obtained even at high temperatures. However, it is necessary to install an optical member for receiving laser light in the surface of the mounting substrate while being adjacent to the laser element, and thus the laser is not suitable for multi-channel high-density mounting and downsizing of the entire module.

Next, the vertical-cavity surface-emitting laser of the second type is a laser having a structure in which the cavity is formed in the direction orthogonal to a semiconductor substrate. Therefore, a light receiving member can be installed at an upper surface of the element, and the laser is advantageous in high density in the surface of the mounting substrate. In the case of this structure, however, the length of the cavity is extremely short because it is determined on the basis of the thickness of a crystal growth film, and it is essentially difficult to obtain high optical output.

The horizontal-cavity surface-emitting laser of the third type has a laser structure that combines excellent features of the above-described two lasers. In the structure, the cavity is formed in the direction parallel with a surface of a substrate, and a reflecting mirror inclined at 45° is integrally formed to emit laser light from the top or rear surface of the substrate.

The present invention relates to the horizontal-cavity surface-emitting laser of the third type. As an example of such a conventional horizontal-cavity surface-emitting laser, Patent Literature 1 discloses a horizontal-cavity surface-emitting laser including an active region with 10 to 100 μm, a distribution Bragg reflector, and an inclined mirror. Further, as a second well-known example, Non-patent Literature 1 reports room-temperature continuous oscillation characteristics of a horizontal-cavity surface-emitting laser including an optical waveguide having an InGaAsP active layer formed on an InP substrate, a reflecting mirror formed at an end portion of the optical waveguide while being inclined at 45°, and a circular lens formed at a position facing the 45°-reflecting mirror on the rear surface of the InP substrate.

Furthermore, as a horizontal-cavity surface-emitting laser having a structure and a mounting mode different from those of the above-described lasers, Non-patent Literature 2 discloses a horizontal-cavity surface-emitting laser of the type in which both of p- and n-electrodes and a light emitting surface are provided at an upper surface of a substrate. In the laser, the surface of the substrate of the chip is bonded onto a mounting substrate using AuSn or Ag epoxy, and then p- and n-electrodes are connected to p- and n-polarities on the mounting substrate, respectively, using gold wires.

CITATION LIST

Patent Literature

Patent Literature 1: Japanese Patent Application Laid-Open Publication No. 2007-5594

Non-Patent Literature

Non-patent Literature 1: IEEE PHOTONICS TECHNOLOGY LETTERS, VOL. 3, NO. 9, 1991, pp. 776-778
Non-patent Literature 2: Proc. of SPIE, vol. 6352 63520U-1

SUMMARY OF INVENTION

Technical Problem

In the horizontal-cavity surface-emitting laser described in each of Patent Literature 1 and Non-patent Literature 1, gold wires are needed in mounting. For stable mounting, it is necessary to have a wire length of about 1 mm. In this case, the signal strength of a high-frequency signal of 25 Gbps or higher is significantly attenuated due to the affects of inductance of the wires. Therefore, these elements are unsuitable for high-speed operations. In addition, it is necessary to connect the gold wire to each element, and thus the mounting cost is increased in multi-channel mounting. In addition, there are limitations to high-density mounting in order to secure regions where the gold wires are connected.

Further, in the horizontal-cavity surface-emitting laser described in each of Patent Literature 1 and Non-patent Literature 1, it is necessary to reduce the area of an electrode on a face bonded to a laser sub-mount as small as possible in order to reduce the parasitic capacity involved in mounting. On the other hand, heat is released from the element to the sub-mount mainly through a p-electrode part, and thus it is necessary to increase the p-electrode part in size from a viewpoint of radiation performance.

Thus, it has been difficult to satisfy both of reduction of capacity and radiation performance in the element of the conventional structure.

The structure as described in Non-Patent Literature 2 is better in radiation performance as compared to the structure described in Patent Literature 1 or Non-patent Literature 1 because the substrate of the element is directly bonded to the laser sub-mount and the entire rear surface of the substrate of the element serves as a radiation path.

However, the structure is not suitable in terms of high speed and simple and high-density mounting because the gold wires are connected to both of p- and n-electrodes.

Accordingly, an object of the present invention is to provide a horizontal-cavity surface-emitting laser excellent in high speed performance and radiation performance, and an optical module using the same.

Solution to Problem

Followings are representative means for achieving the above-described object.

According to an aspect of the present invention, provided is a horizontal-cavity surface-emitting laser including, on a semiconductor substrate: a cavity structure that includes a multilayer structure obtained by stacking a first conductive-type cladding layer, an active layer for generating light, and a second conductive-type cladding layer in this order and that reflects or resonates light in the in-plane direction; a waveguide layer that is constructed in the cavity structure and its extended regions on the semiconductor substrate to guide the light generated from the active layer; and a reflecting part that is constructed at one end of the optical waveguide layer and changes the light path of laser light emitted from the cavity structure to emit the laser light from the rear surface of the semiconductor substrate, wherein a first electrode constructed on the semiconductor substrate around a side region of the cavity structure and the reflecting part and a second electrode constructed on the main surface of the cavity structure are provided, the first electrode includes an electrode (1) that is constructed around one side region of the reflecting part located in the perpendicular direction to the traveling direction of light guided through the waveguide layer and an electrode (2) that is constructed around one side region of the cavity structure and the other side region of the reflecting part that are located in the direction parallel to the traveling direction of light guided through the waveguide layer, and the shape of the electrode (2) has different widths at at least two positions.

With such a configuration, it is possible to improve the radiation performance without increasing the parasitic capacity. Further, the width of the n-type electrode at a lateral part of the cavity is expanded towards the optical cavity relative to the width of the n-type electrode at a lateral part of the reflecting mirror, so that a distance between the p- and n-type electrodes can be shortened. Thus, the resistance of the element can be reduced. Along with this, it is possible to obtain excellent high-speed performance. In addition, since a flag-like concave is formed in a plane, the simplicity and accuracy of the above-described positioning can be advantageously improved.

Advantageous Effects of Invention

According to an aspect of the present invention, the first electrode is directly formed on the first conductive layer laminated on the substrate, and no pn junction is provided immediately below. Therefore, it is possible to significantly suppress an increase in the parasitic capacity when the area of an electrode is expanded. Thus, by employing a mounting structure in which the supporting member such as a metal member is brought into contact with the first electrode part to form a radiation path, the radiation performance can be considerably improved without increasing the parasitic capacity. Further, a contact area between the electrode and the semiconductor can be increased, so that the contact resistance can be advantageously reduced and the resistance of the element can be also reduced.

Further, the element can be mounted in a flip-chip manner on the optical element mounting substrate having electric lines provided, and thus attenuation of a high-frequency signal caused by inductance can be reduced as compared to a case of using gold wires.

Furthermore, it is possible to design impedance matching with the use of patterning of the electric lines, and the degree of freedom of electric design can be considerably enhanced. Thus, the present invention is advantageous in high speed.

DESCRIPTION OF EMBODIMENTS

Hereinafter, embodiments will be described in detail using the drawings.

A structural example of a conventional horizontal-cavity surface-emitting laser will be described using FIGS. 1A and 1B. Hereinafter, a structure of the element will be described.

Figure 1A:
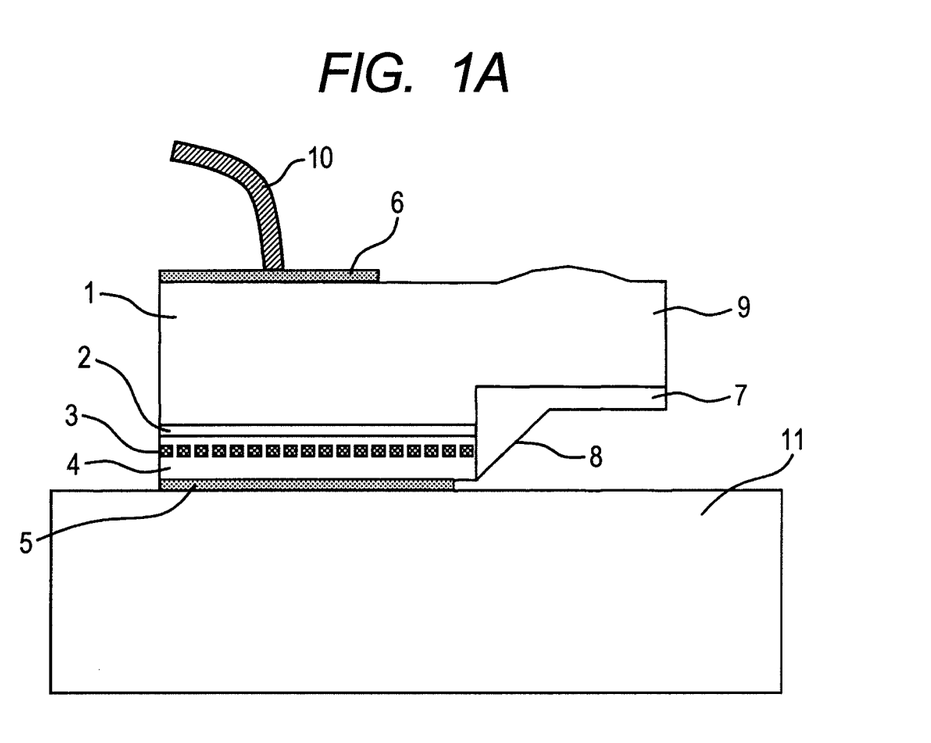
FIG. 1A is a cross-sectional view of a horizontal-cavity surface-emitting laser having a conventional structure in the optical axis direction.

FIG. 1A is a cross-sectional view of the element in the optical axis direction. The element is formed on an n-type InP substrate 1.

Light is generated by injecting current to an InGaAsP active layer 2 from an n-electrode 6 on the rear surface of the substrate 1 and a p-electrode 5 on the top surface of the substrate 1. The generated light propagates in a waveguide in which a diffraction grating 3 with the refractive index periodically changed is formed. The light is fed back by the diffraction grating, so that laser oscillation occurs. The laser is a so-called DFB (Distributed Feedback) laser. The laser light thus generated is totally reflected by a 45°-reflecting mirror 8 formed by etching one end of the waveguide to be guided in the direction of the rear surface of the substrate, and is emitted from an emitting surface 9 of the rear surface of the substrate. The element is formed into a chip, and then is die-bonded onto a laser sub-mount 11 by AuSn solder while the face where the p-electrode 5 is provided is used as a bonding face. On the other hand, the n-electrode is coupled to the ground (not shown) using a gold wire 10 with a diameter of 50 μm.

Figure 1B:
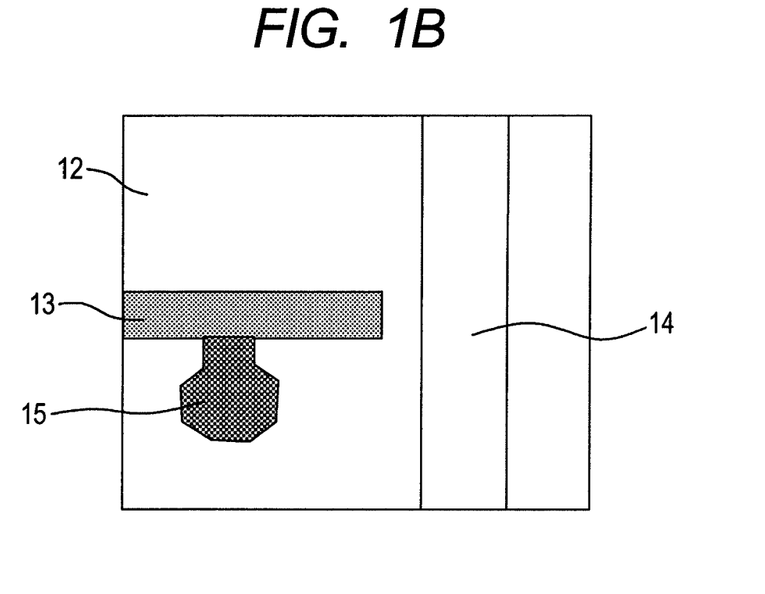
FIG. 1B is a planar view in which the horizontal-cavity surface-emitting laser having a conventional structure is mounted.

FIG. 1B is a planar view in which the element is mounted. The surface of the element except a p-electrode 13, an extracting pad 15, and a 45°-reflecting mirror 14 is covered with an SiO$_2$ insulating film 12 as a protective film. In the horizontal-cavity surface-emitting laser with such a structure, the cavity is formed in the surface of the substrate. Thus, the length of the cavity can be made long, and high output can be easily realized. Further, since light is vertically emitted to the surface of the substrate, a light receiving member can be disposed on an upper face of the element, and thus the invention is advantageous in high-density mounting. In addition, since an integrated lens can be relatively easily formed on the emitting surface, highly-efficient optical coupling to a light receiving system can be realized. Thus, the element is excellent in power saving and reduction in the number of parts of and downsizing of the module.

First Embodiment

Figure 2A:
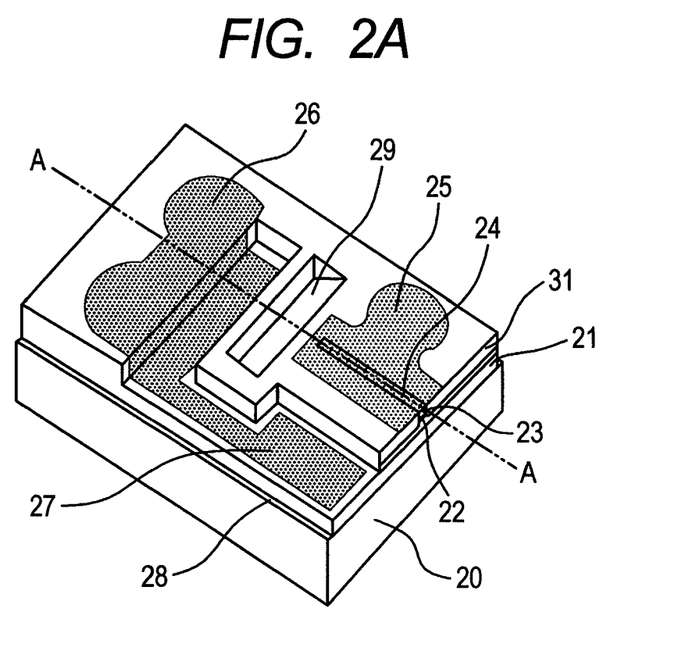
FIG. 2A is a birds-eye view of a surface of a horizontal-cavity surface-emitting laser according to a first embodiment of the present invention.
Figure 2B:
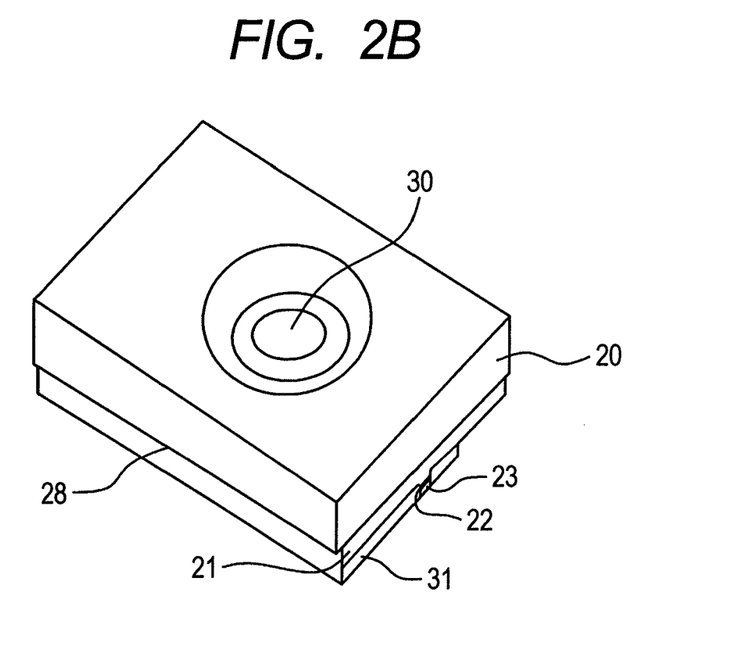
FIG. 2B is a birds-eye view of a rear surface of the horizontal-cavity surface-emitting laser according to the first embodiment of the present invention.

A structure of a horizontal-cavity surface-emitting laser according to a first embodiment will be described using FIG. 2A, FIG. 2B, FIGS. 3A to 3F, and FIGS. 4A to 4C. The embodiment is an example of applying the present invention to a horizontal-cavity surface-emitting laser with a width of 250 μm. FIG. 2A is a birds-eye view of a surface of a laser element, and FIG. 2B shows a light emitting surface of the laser element. The horizontal-cavity surface-emitting laser of the embodiment is formed in such a manner that an n-type semiconductor layer 21, an active layer 22, and a p-type semiconductor layer 23 are laminated and grown in this order on an Fe-doped semi-insulating semiconductor substrate 20, and further a diffraction grating layer (not shown) is formed directly on the active layer 22. N-doped InP is used for the n-type semiconductor layer 21, p-doped InP is used for the p-type semiconductor layer 23, and, for example, a strain quantum well structure of InGaAlAs is used for the active layer 22. In addition, GaInAsP is used for the diffraction grating layer. Further, a reflecting mirror 29 formed by etching a semiconductor buried layer is provided. In this case, semi-insulating Fe-doped InP or the semiconductor material same as a p-type cladding layer may be used for the semiconductor buried layer.

Further, a concave step is formed on the semi-insulating semiconductor substrate 20, and further an integrated lens 30 formed by etching the semi-insulating semiconductor substrate 20 is integrated at the bottom of the step. In addition, the surface of the integrated lens 30 is coated with a nonreflecting coating such as an alumina thin layer. In this case, a p-type electrode 25 is formed on an upper part of the cavity. In addition, the p-type semiconductor layer 23 and the active layer 22 are dug to reach the n-type semiconductor layer 21, and an n-type electrode 27 is formed on the n-type semiconductor layer 21. In this case, the n-type electrode 27 is formed so as to surround the reflecting mirror 29 and the cavity part as shown in FIG. 2A, and the width of the electrode at a lateral part of the reflecting mirror is different from that at a lateral part of the cavity. With such an electrode structure, the area of the electrode can be increased, and thus contact resistance can be reduced.

Further, the width of the electrode is changed so that the n-type electrode 27 at a lateral part of the cavity is concaved toward the cavity, and thus a distance between the p-type electrode 24 and the n-type electrode 27 can be shortened. In addition, element resistance can be reduced by shortening the travelling distance of carriers.

Next, a detailed method of producing the horizontal-cavity surface-emitting laser to which the present invention is applied will be described using FIGS. 3A to 3F. Each of FIGS. 3A to 3F is a cross-sectional view for showing a manufacturing step of the horizontal-cavity surface-emitting laser element shown in the first embodiment. It should be noted that each cross-section is one taken along the line A-A of FIG. 2A.

As shown in FIGS. 3A to 3F, the InGaAlAs quantum well-type horizontal-cavity surface-emitting laser element with a wavelength of 1.3 μm according to the embodiment has a BH (Buried Hetero) structure in which a semiconductor hetero structure processed in a stripe shape is buried with a semi-insulating layer. In this example, a highly-resistive semi-insulating layer 87 obtained by doping Fe (iron) to InP is buried around a striped optical waveguide part in the BH structure. An n-type semiconductor is obtained by doping sulfur (atomic symbol:S) and a p-type semiconductor is obtained by doping Zinc (atomic symbol:Zn).

Figure 3A:
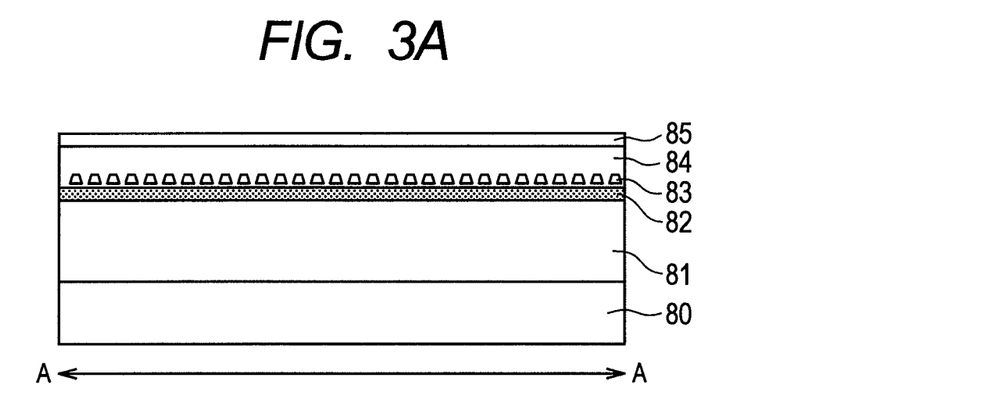
FIG. 3A is a cross-sectional view for showing manufacturing step of a horizontal-cavity surface-emitting laser element of the first embodiment.

FIG. 3A shows a cross-sectional view of a multilayer structure in the embodiment. As a semi-insulating semiconductor substrate 80, an Fe-doped InP semiconductor substrate is used. On the semi-insulating semiconductor substrate, provided are an n-type semiconductor layer 81 and an active layer 82. Although not shown in the drawing, the active layer 82 has a multiple quantum well structure made of undoped InGaAlAs that is obtained by stacking a well layer WL with a thickness of 7 nm and a barrier layer BL with a thickness of 8 nm by 5 cycles between an n-type optical confinement layer made of n-type InGaAlAs and a p-type optical confinement layer made of p-type InGaAlAs. Such a multiple quantum well structure is designed so as to be able to sufficiently realize characteristics as a laser. On the active layer 82, a diffraction grating layer 83 made of InGaAsP material is buried in a p-type semiconductor layer 84 made of p-type InP functioning as a cladding layer. Further, a contact layer 85 made of p-type InP is disposed thereon. The active layer 82 and the diffraction grating layer 83 are structured so that the oscillation wavelength of the DFB laser at room temperature becomes 1310 nm.

A light guiding function occurs by sandwiching the active layer 82 between cladding layers with the refractive index lower than that of the active layer 82, and is realized by a multilayer structure of cladding layer/active layer/cladding layer. However, the optical confinement layers are provided while sandwiching the quantum well layer in a concrete mode to strengthen optical confinement in the active layer. It is obvious that the refractive index of each cladding layer is lower than that of the optical confinement layer. It should be noted that the n-type semiconductor layer 81 provided on the semi-insulating semiconductor substrate 80 serves as a first semiconductor layer functioning as a cladding layer in the embodiment.

The polarity of the diffraction grating layer 83 is of p-type. Such a structure is referred to as a refractive index coupling-type DFB laser because only the refractive index is periodically changed in the light propagation direction. It should be noted that the diffraction grating 83 is uniformly formed in the entire region of the DFB laser in the embodiment, but a so-called phase shift structure in which the phase of the diffraction grating is shifted may be provided at a part of the region if necessary.

Further, the DFB laser is used in the embodiment, but a DBR laser may be used.

Next, a manufacturing process of the horizontal-cavity surface-emitting laser element according to the embodiment will be described using FIGS. 3A to 3F.

As shown in FIG. 3A, the n-type semiconductor substrate 81 (cladding layer) configured using an n-type InP substrate is first grown on the semi-insulating substrate 80 to form a structure of the laser part, and then the active layer 82 made of InGaAlAs that is configured using the optical confinement layer made of n-type InGaAlAs, the multiple strain quantum well layer made of InGaAlAs, and the optical confinement layer made of p-type InGaAlAs is formed.

Next, a semiconductor multilayer structure including the diffraction grating layer 83 made of InGaAsP is formed thereon. Further, the p-type semiconductor layer 84 (cladding layer) made of p-type InP is formed thereon, and then the contact layer 85 made of p-type InGaAs is formed. The carrier concentration by doping is $10^{18}$ cm$^{-3}$ each for n-type and p-type. A protective mask is provided by covering the InP wafer having the multilayer structure with a silicon dioxide film. Although not shown in the drawing, the contact layer, the p-type cladding layer 84, the diffraction grating layer 83, the active layer 82, and a part of the n-type semiconductor layer 81 are etched using the silicon dioxide mask, so that an optical waveguide is formed (see FIG. 3B). For the etching, for example, any one of dry etching such as RIE (Reactive Ion Etching) using chlorine gas, wet etching using bromine solution or the like, and the both of them may be used.

Figure 3B:
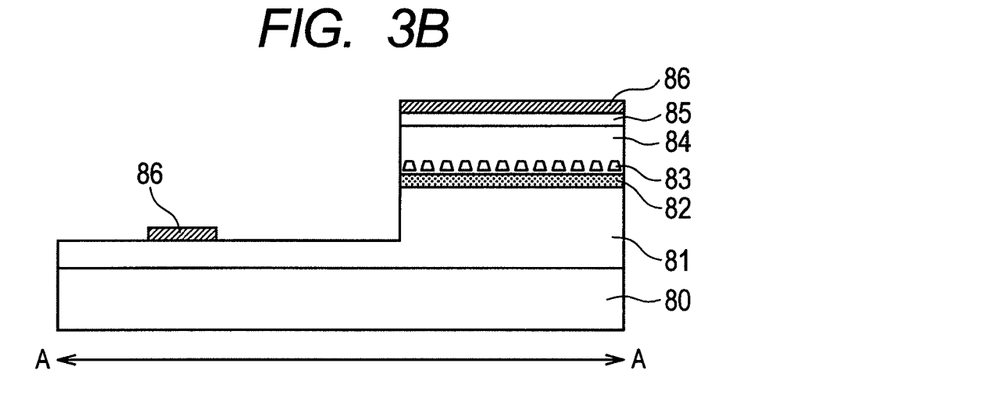
FIG. 3B is a cross-sectional view for showing a manufacturing step of the horizontal-cavity surface-emitting laser element of the first embodiment.

Next, as shown in FIG. 3B, a patterning mask was formed at a region for burying and growing with the use of a silicon oxide film 86. A semiconductor is not grown at the region covered with the silicon oxide film 86 at the time of burying and growing. Accordingly, some parts of a buried layer can be arbitrarily grown using the patterning mask. In this case, the patterning film was formed in such a shape that formed an n-electrode, and a buried layer was grown so that the n-type semiconductor layer 81 was exposed at the region where the n-electrode was formed later.

Figure 3C:
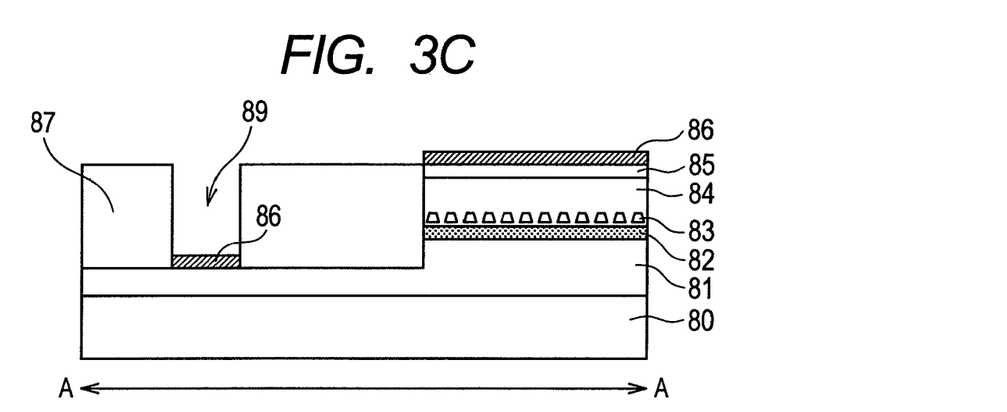
FIG. 3C is a cross-sectional view for showing manufacturing step of the horizontal-cavity surface-emitting laser element of the first embodiment.

Next, as shown in FIG. 3C, the sample was carried into a crystal growth furnace and a semi-insulating layer 87 made of Fe-doped InP was buried and grown at 600° C. using an MOVPE method. The BH structure was formed by the etching step and the process of growing the buried layer again. The BH structure is a structure in which the both sides of the optical waveguide in the light travelling direction are buried using material capable of confining light. In general, the material used for confinement is of high resistance. In the embodiment, used was the semi-insulating layer 87 made of Fe-doped highly-resistive InP. It should be noted that the right and left sides of the optical waveguide in the light travelling direction were buried and an end portion of the optical waveguide on the light emitting side was buried using the semi-insulating layer 87 in the step of forming the buried structure. The reason of burying the tip end of the optical waveguide using InP is as follows: a part of the 45°-inclined mirror to be etched can be configured using only InP material (Fe—InP), and the mirror formed by etching can be easily processed to be completely flat.

Figure 3D:
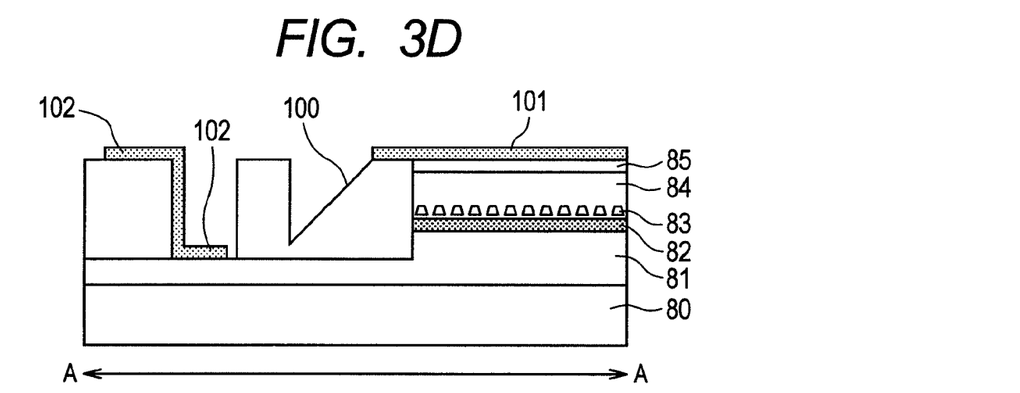
FIG. 3D is a cross-sectional view for showing a manufacturing step of the horizontal-cavity surface-emitting laser element of the first embodiment.

Thereafter, as shown FIG. 3D, the silicon oxide film 86 used as a selective growth mask for burying and growing was removed to form a silicon nitride film (not shown) for an etching mask, and the semi-insulating layer 87 made of Fe-doped InP was etched to be inclined at 45°, so that a reflecting mirror 100 was formed. In the inclined etching, the wafer was etched using CAIBE (Chemically Assisted Ion Beam Etching) using chlorine and argon gas while being inclined at 45° to realize 45°-etching. It should be noted that the etching method using CAIBE was described in the embodiment. However, RIBE (Reactive Ion Beam Etching) using chlorine gas or wet etching may be used. The cross-section of the reflecting mirror 100 in the optical axis direction was formed in a "re"-shape in katakana. However, the cross-section may be formed in a V-shape, or a structure only with an inclined face may be employed. Further, a groove for electrically separating the elements from each other was also simultaneously formed on the wafer at the time of etching.

Next, after the silicon nitride film was removed, an n-type electrode 102 was evaporated at a dug part 89 of the n-type semiconductor layer 81 to perform an alloy process at 370° C.

Thereafter, a p-electrode 101 (p-type electrode) was evaporated at an upper part of the p-type InGaAs contact layer 85. Further, the rear surface of the substrate was polished to have a width of 130 μm, and then a silicon nitride mask 90 was formed on the rear surface of the substrate.

Figure 3E:
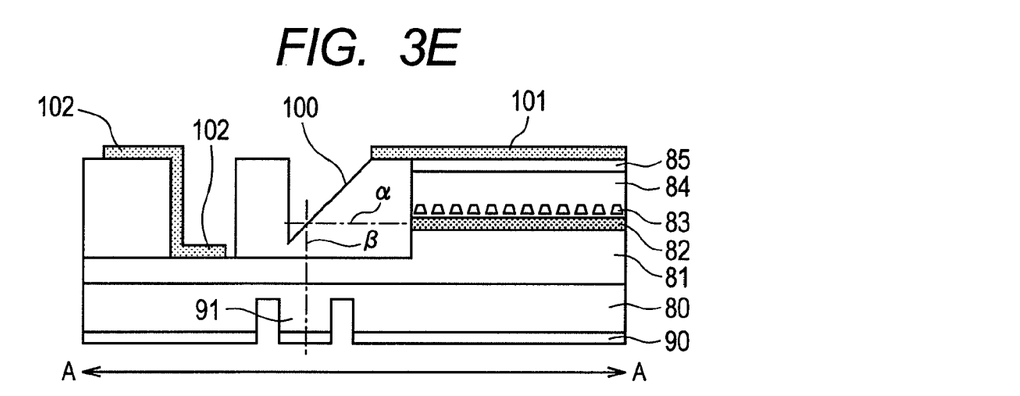
FIG. 3E is a cross-sectional view for showing a manufacturing step of the horizontal-cavity surface-emitting laser element of the first embodiment.
Figure 3F:
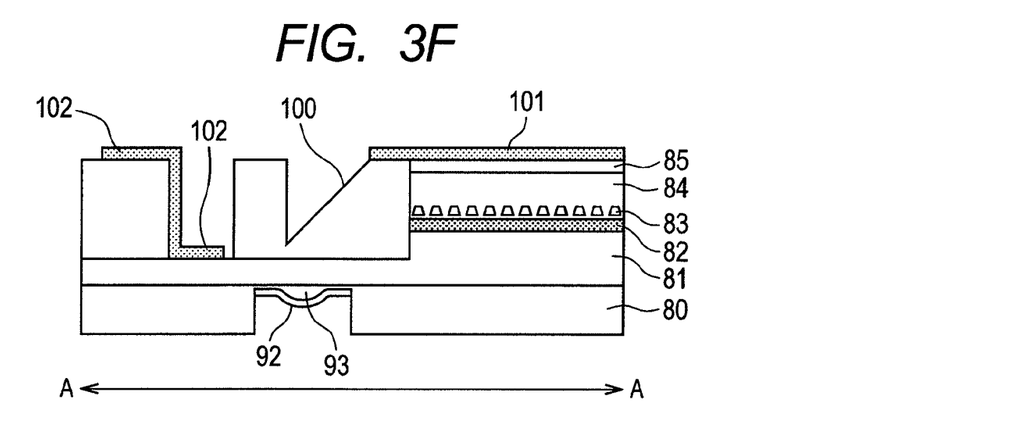
FIG. 3F is a cross-sectional view for showing a manufacturing step of the horizontal-cavity surface-emitting laser element of the first embodiment.

Subsequently, as shown in FIG. 3E, the structure was etched by RISE using mixed gas of methane and hydrogen to be in a circular shape with a diameter of 125 μm and a depth of 20 μm. In this case, the silicon nitride mask 90 was formed in such a manner that the center position of the circle of the cylinder intersects with a perpendicular line (β) descending from an intersecting point between an extended line (α) of the active layer 82 and the 45° C.-inclined mirror. It should be noted that the circular shape may be an oval shape in some cases. Subsequently, as shown in FIG. 3F, the silicon nitride mask 90 was removed and the silicon nitride mask provided at an upper part of a column-like part 91 surrounded by a doughnut-like dug part was removed to perform wet etching. Accordingly, the surface of the column-like part was beginning to be etched and the corners thereof were removed, so that a rear-face InP lens 93 was formed. It should be noted that the surface of the lens is covered with a nonreflecting film 92 in the subsequent step. Since the convex lens is formed on the beam emitting surface, it is possible to obtain beams whose emission angles are narrow and which are high in parallelism.

The beam expanding angle of the horizontal-cavity surface-emitting laser element of the embodiment was 2° and a narrow emission beam forming a circular beam spot with a diameter of 120 μm was obtained at a position apart from the rear surface of the laser by 100 μm.

Figure 4A:
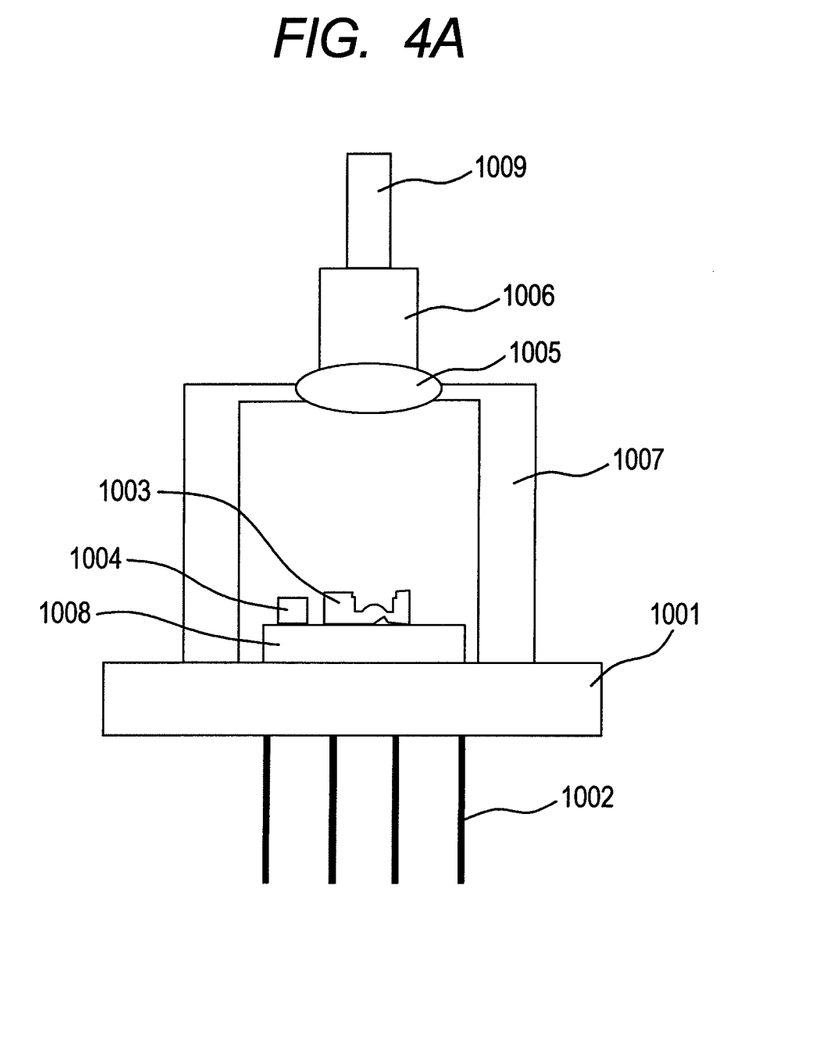
FIG. 4A is a detailed diagram in which the horizontal-cavity surface-emitting laser according to the first embodiment of the present invention is mounted.
Figure 4B:
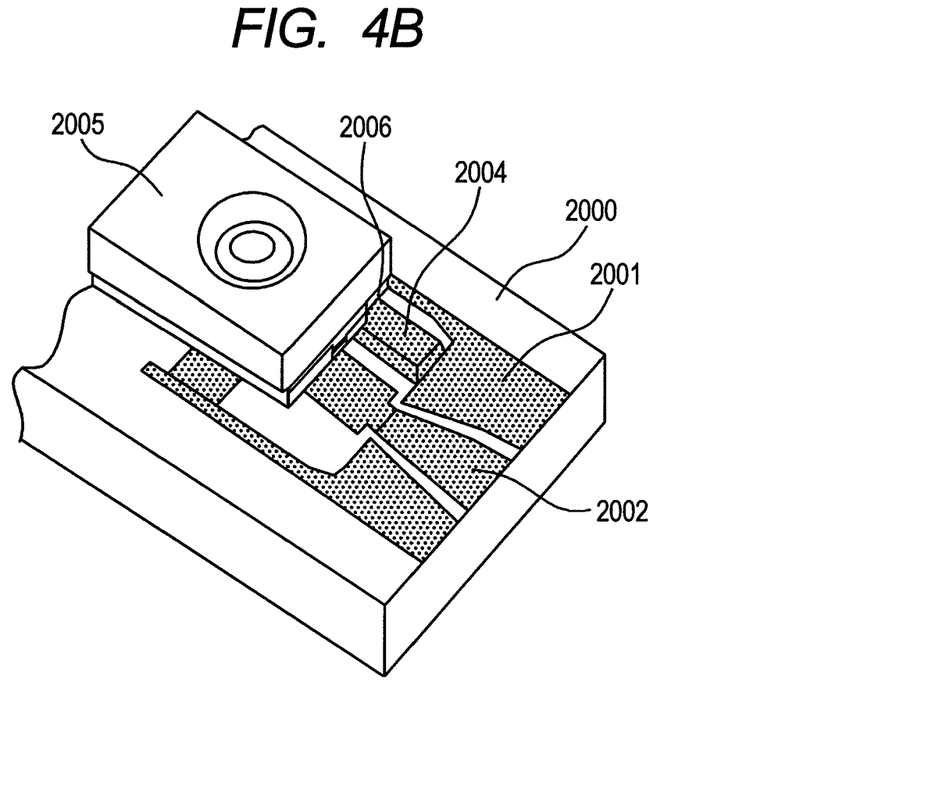
FIG. 4B is a birds-eye view in which the horizontal-cavity surface-emitting laser according to the first embodiment of the present invention is mounted.
Figure 4C:
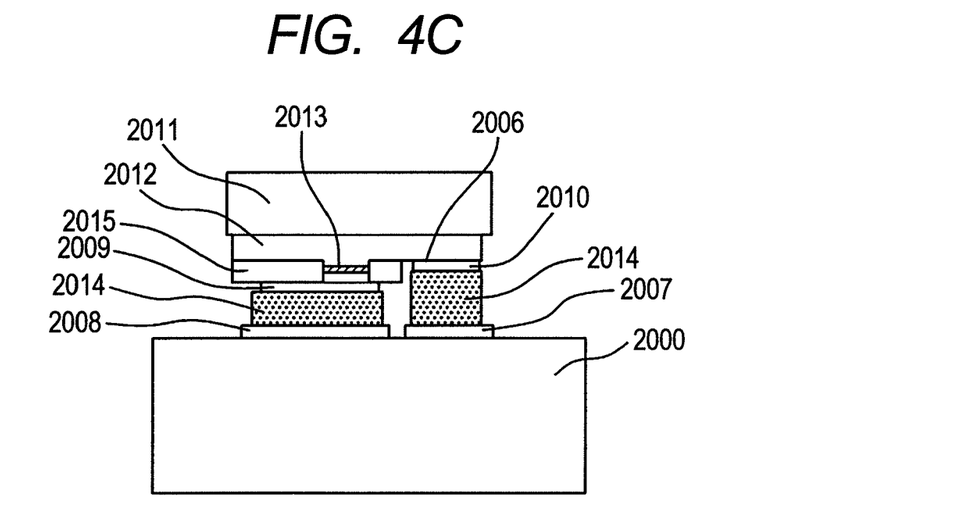
FIG. 4C is a cross-sectional view in the direction orthogonal to the optical axis in which the horizontal-cavity surface-emitting laser according to the first embodiment of the present invention is mounted.

An example of an optical module package to which the present invention is applied is shown in FIGS. 4A to 4C. FIG. 4A is a detailed diagram in which the horizontal-cavity surface-emitting laser according to the first embodiment of the present invention is mounted. FIG. 4B is a birds-eye view in which the horizontal-cavity surface-emitting laser is mounted. FIG. 4C is a cross-sectional view in the direction orthogonal to the optical axis in which the horizontal-cavity surface-emitting laser is mounted.

In FIG. 4A, an optical element mounting substrate 1008 on which a laser diode 1003 is mounted in a junction-down manner and a photodiode 1004 are mounted on a stem 1001. In the embodiment, the diode 1003 corresponds to the horizontal-cavity surface-emitting laser. In this case, the laser diode 1003 is mounted on the optical element mounting surface in a flip-chip manner.

Further, as shown in FIG. 4A, the horizontal-cavity surface-emitting laser element manufactured in the above-described steps shown in FIGS. 3A to 3F was mounted on the optical element mounting substrate 1008 in a junction-down manner using a laser sub-mount obtained by patterning AuSn solder on an AlN substrate with a thickness of 200 μm, and the laser sub-mount on which the horizontal-cavity surface-emitting laser element LD was mounted was mounted on the stem 1001 using Ag epoxy. Thereafter, a silica single-mode optical fiber compliant with 1.3 μm light was used fox an optical fiber 1009, and alignment was completed. Thereafter, an optical fiber supporting part 1006 and a cap 1007 were mounted to fix the optical fiber.

Next, details of mounting will be illustrated in FIGS. 4B and 4C. On the optical element, formed are electric lines 2001 and 2002 so as to satisfy desired impedance matching. In this case, 50Ω electric lines were used. Further, a supporting part 2004 which is formed at the laser diode 1003, at which an n-electrode is evaporated, and which is fitted into the shape of a dug groove 2006 is provided.

In the case of mounting, positioning can be easily performed by fitting the supporting part into the dug groove 2006. Further, FIG. 4C shows a cross-sectional view in the direction orthogonal to the optical axis in which the element is mounted. As shown in the drawing, the supporting part used for fitting is formed using solder 2014, and is designed to be brought into contact with the n-type electrode. Therefore, a radiation path that passes through the supporting part from the element to the optical element mounting substrate is formed, and thus the radiation performance of the element during operations can be significantly improved. It should be noted that the supporting part used for fitting may be formed using metal material such as copper or alloy made of copper and tungsten that is excellent in thermal conductivity.

Further, as being apparent from the drawing, portion with which the supporting part is brought into contact has no pn junction. Therefore, even if the area of the n-electrode to be brought into contact with the supporting part is expanded, the parasitic capacity is not increased. Thus, such a structure enables to improve the radiation performance without increasing the parasitic capacity. Further, the width of the n-electrode at a lateral port of the cavity is more expanded towards the optical cavity than the width of the n-electrode at a lateral part of the reflecting mirror, so that a distance between the p- and n-electrodes can be shortened, and the resistance of the element can be reduced. In addition, a flag-like concave (a region represented by the reference numeral 27 of FIG. 2A is formed by jointing two kinds of rectangles together while their short sides are coupled to each other, the length of the short side of one rectangle is longer than that of the other, and this shape is hereinafter referred to as a flag-like shape) is formed in a plane, and thus the simplicity and accuracy of the above-described positioning can be advantageously improved.

It should be noted that an example of applying the present invention to the InGaAlAs quantum well-type laser with a wavelength of 1.3 μm formed on the InP substrate was shown in the embodiment. However, the material of the substrate and the active layer, and the oscillation wavelength are not limited to the example. The present invention can be similarly applied to other materials such as an InGaAsP laser with a wavelength of 1.55 μm.

Further, the embodiment of the BH structure was shown above. However, the present invention can be applied to an RWG (Ridge Wave Guide) structure.

Second Embodiment

Figure 5A:
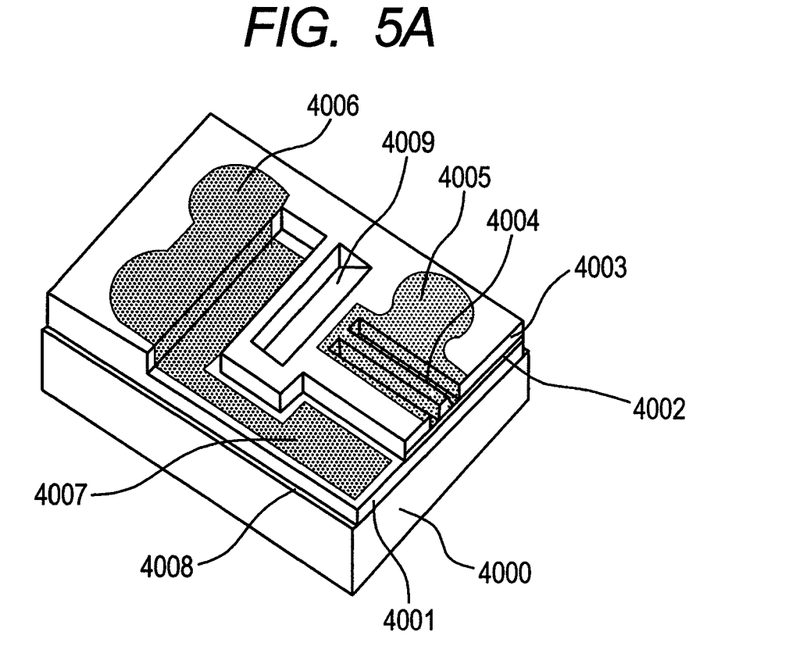
FIG. 5A is a birds-eye view of a surface of a horizontal-cavity surface-emitting laser according to a second embodiment of the present invention.
Figure 5B:
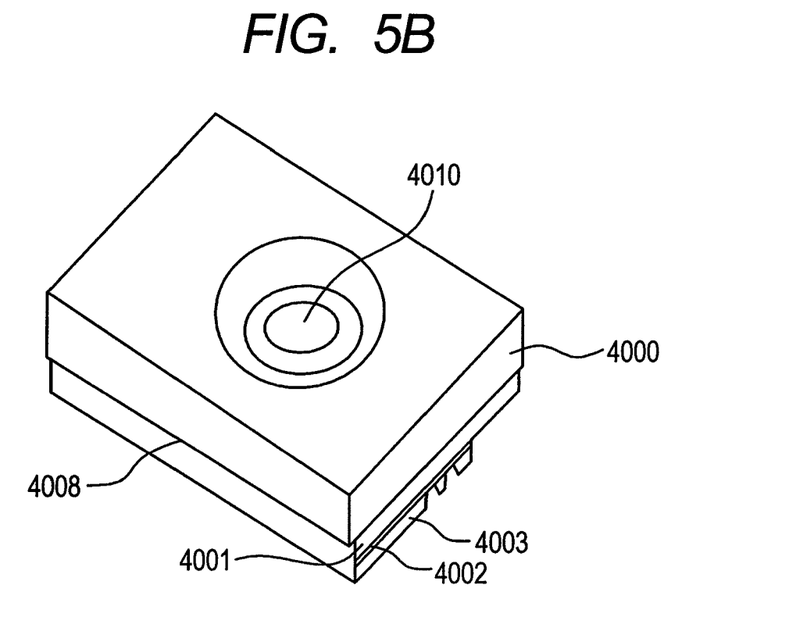
FIG. 5B is a birds-eye view of a rear surface of the horizontal-cavity surface-emitting laser according to the second embodiment of the present invention.
Figure 5C:
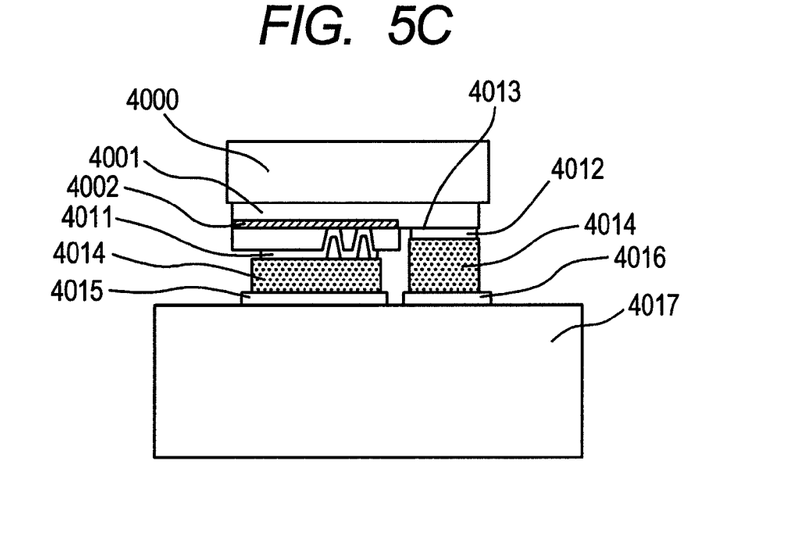
FIG. 5C is a cross-sectional view in the direction orthogonal to the optical axis in which the horizontal-cavity surface-emitting laser according to the second embodiment of the present invention is mounted.

A second embodiment is an example in which the present invention is applied to an RWG-type horizontal-cavity surface-emitting laser with a width of 250 μm. FIG. 5A is a birds-eye view of a surface of the laser element, and FIG. 5B shows a light emitting surface. Further, FIG. 5C is a cross-sectional view in the direction orthogonal to the optical axis in which the laser element is mounted. The structure of the laser element will be described in detail using FIG. 5A and FIG. 5B. The laser element is formed in such a manner that an n-type semiconductor layer 4001, an active layer 4002, and a p-type semiconductor layer 4003 are laminated and grown in this order on an Fe-doped semi-insulating semiconductor substrate 4000, and further a diffraction grating layer (not shown) is formed directly on the active layer 4002. N-doped InP is used for the n-type semiconductor layer 4001, p-doped InP is used for the p-type semiconductor layer 4003, and, for example, a strain quantum well structure of InGaAlAs is used for the active layer 4002. In addition, GaInAsP is used for the diffraction grating layer. Further, a reflecting mirror 4009 formed by etching a semiconductor buried layer is provided.

Further, as shown in FIG. 5A, the p-type semiconductor layer 4003 provided directly on the cavity has a ridge shape etched in a convex stripe shape. A p-type electrode 4004 is formed at an upper part of the ridge shape. In addition, the p-type semiconductor layer 4003 and the active layer 4002 were dug to reach the n-type semiconductor layer 4001, and an n-type electrode 4007 was formed on the n-type semiconductor layer 4001. In this case, as shown in FIG. 5A, the n-type electrode 4007 is formed so as to surround the reflecting mirror 4009 and the cavity, and the width of the electrode at a lateral part of the reflecting mirror 4009 is different from that at a lateral part of the cavity. Further, as shown FIG. 5B, a lens having the same shape as that in the first embodiment was formed on the rear surface of the semi-insulating semiconductor substrate 4000.

Next, an outline of a method of manufacturing the laser element will be described. In the first place, the active layer, the diffraction grating, and the p-type semiconductor layer 4003 with the same specifications as those in the first embodiment were grown in this order on the semi-insulating semiconductor substrate 4000 using an MOCVD method. Although not shown in FIG. 5, the contact layer with the same specification as that in the first embodiment was formed. Next, the active layer, the diffraction grating layer, and the p-type semiconductor layer 4003 were partially etched using a normal photolithography process and wet etching, and then an Fe-doped semi-insulating semiconductor layer was grown as a waveguide layer at a region where the reflecting mirror was formed later. It should be noted that a semi-insulating semiconductor to which other heavy elements were doped or the semiconductor same as the p-type semiconductor layer 4003 may be used for the waveguide portion.

Subsequently, with a combination of normal photolithography and dry and wet etching, the ridge portion was formed. In this case, a portion where an n-type electrode was formed later was formed at the same time. Thereafter, the reflecting mirror 4009, an electricity separation groove 4008, the n-type electrode 4007, the p-type electrode 4004, and a lens 4010 were formed in the same manner as the first embodiment.

Thereafter, the element was formed into a chip so as to have a cavity length of 150 μm, and the completed element was mounted on a sub-mount having a supporting member in a junction-down manner as similar to the first embodiment.

As a result of evaluating the laser element thus manufactured, 25 Gbit/s operations at 100° C. could be realized in a reflection of highly-efficient current injection by the ridge structure and the improvement of radiation performance and reduction in element capacity as effects of the present invention.

Third Embodiment

Figure 6:
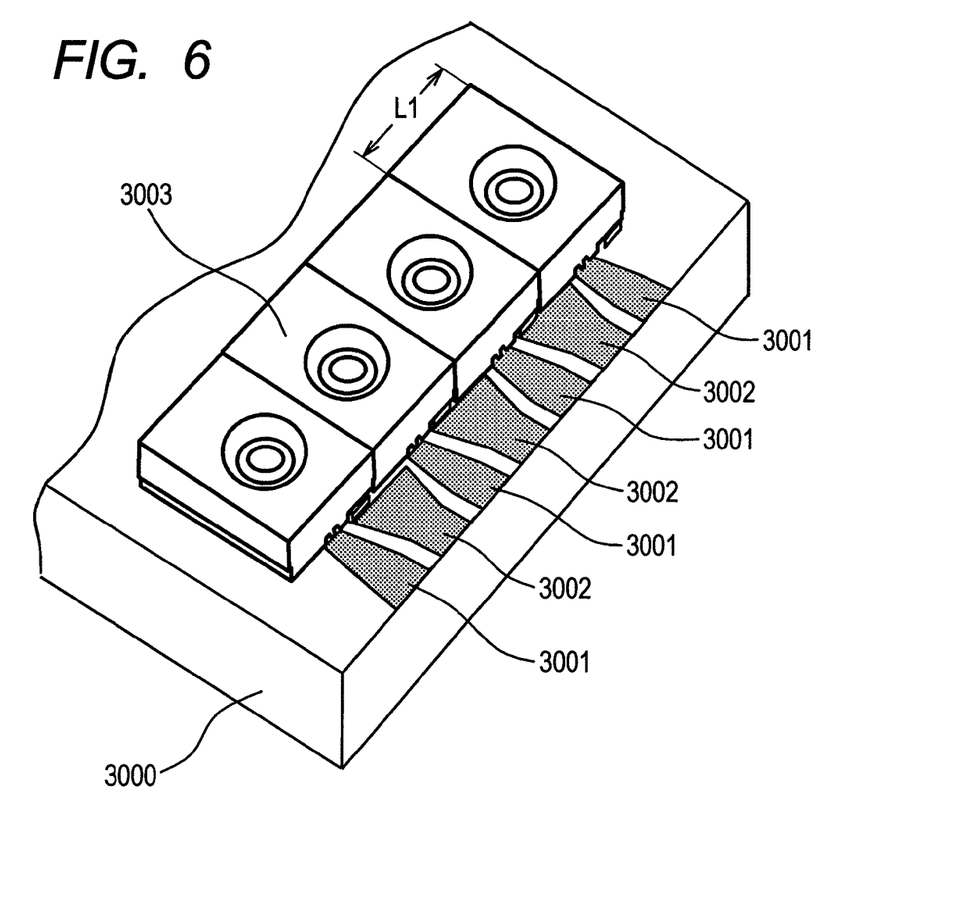
FIG. 6 is a birds-eye view in which an array-type vertical-cavity surface-emitting laser according to a third embodiment of the present invention is mounted.

FIG. 6 shows a third embodiment in which the present invention is applied to the horizontal-cavity surface-emitting laser. FIG. 6 is a birds-eye view of the laser element. The embodiment is an array-type laser in which plural horizontal-cavity surface-emitting lasers were formed on the same substrate. In the embodiment, a 4-channel parallel structure was employed. Further, the RWG type or the BH type may be employed. However, the embodiment employed the RWG type. Laser elements 3003 forming the 4-channel array are electrically separated from each other through the electricity separation groove 4008 as shown in the single laser element of FIG. 3. The manufacturing method is the same as the second embodiment. It should be noted that the substrate used in the embodiment was a semi-insulating semiconductor substrate, but a lamination structured substrate formed using semi-insulating semiconductor layers and conductive semiconductor layers may be used. In such a lamination structured substrate, it is possible to reduce the etch pit density causing lattice defects as compared to a normal semi-insulating substrate. Thus, it is possible to improve the reliability and yield in manufacturing.

Following the completion of the wafer process, the element was formed into a 4-channel array chip. An element width L1 in the direction orthogonal to the cavity of the element is 250 μm. Specifically, an interval between lenses from which light is emitted is also 250 μm, and the pitch width is equal to that of a ribbon fiber of a commercially available product. Specifically, a multi-channel optical module could be easily produced by using the element. The cross-sectional view of the optical module is the same as FIG. 4A, and the fiber is a 4-channel ribbon fiber. 4 channels are arranged in the direction orthogonal to the drawing. Further, as shown in FIG. 6, the supporting part for fitting is formed on the optical element mounting substrate as similar to the second embodiment. Thus, the element could be easily positioned.

A multi-channel optical module that was capable of transmitting data at 25 Gbps per channel, namely, 100 Gbps in total and that was excellent in manufacturing cost could be produced by using the element.

Fourth Embodiment

Figure 7:
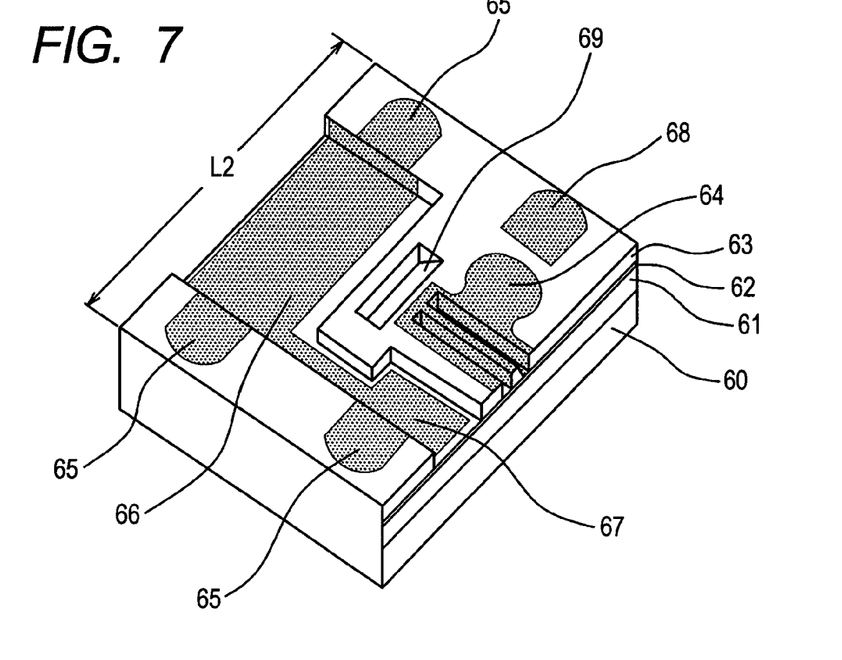
FIG. 7 is a birds-eye view of a horizontal-cavity surface-emitting laser according to a fourth embodiment of the present invention.

FIG. 7 shows a fourth embodiment in which the present invention is applied to a horizontal-cavity surface-emitting laser with a width L2 of 500 μm. The detailed structure of the element is as follows.

On a semi-insulating substrate 60, laminated are an n-type semiconductor layer 61, an active layer 62, and a p-type semiconductor layer 63 in this order. It should be noted that although not shown in the drawing, the laser is a DFB-type laser in which a diffraction grating layer is provided inside the p-type semiconductor layer 63. It should be noted that the RWG type later was employed in the embodiment, but the BH type may be employed.

By expanding the element width L2 of the laser to 500 μm, n-electrode pads 65 can be formed at stud parts provided at lateral parts of regions where the cavity and the mirror are provided. Therefore, the entire region in front of the mirror can be used as an n-electrode formation region, and the area of the n-electrode can be significantly expanded. Therefore, reduction in element resistance and the improvement of radiation performance could be achieved by using the structure, and optical output at 85° C. could be improved to about twice that of a conventional horizontal-cavity surface-emitting laser.

Fifth Embodiment

Figure 8:
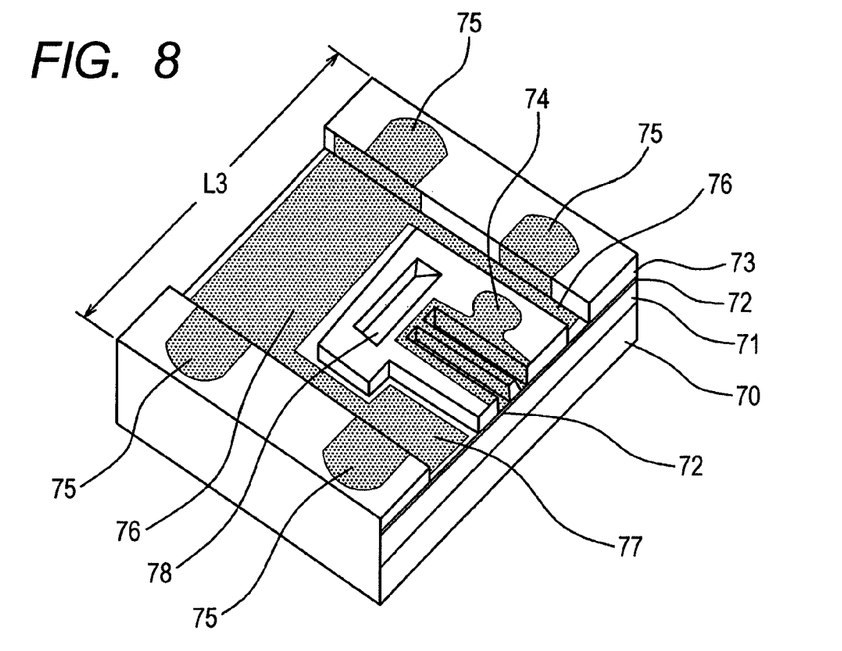
FIG. 8 is a birds-eye view of a horizontal-cavity surface-emitting laser according to a fifth embodiment of the present invention.

FIG. 8 shows a fifth embodiment in which the present invention is applied to a horizontal-cavity surface-emitting laser. The laser is a horizontal-cavity surface-emitting laser with a width L3 of 500 μm as similar to the structure of the third embodiment.

In the fourth embodiment, the n-electrode surrounded one of the lateral parts of the reflecting mirror and the cavity. However, the n-electrodes are formed on the both sides of the lateral parts of the reflecting mirror and the cavity in the structure. In this case, in order to secure a region for mounting the p-electrode pads, only the n-electrode at a lateral part where the p-electrode pads of the reflecting mirror and the cavity are not provided has a flag-like concave (the shape of coupled two rectangles in the region represented by the reference numeral 77 in the drawing is referred to as a flag-like shape as defined in the first embodiment). Dug grooves for n-electrodes are formed on the both sides of the reflecting mirror and the cavity in the structure. Thus, there are concerns that the pad area of the p-electrode needs to be reduced, and the mounting strength on the p-side is reduced. However, since the area of the p-pad is reduced, the parasitic capacity of the element can be reduced. It should be noted that since the area of the n-electrode can be expanded, radiation characteristics can be further improved. It should be noted that the RWG type laser was employed in the embodiment, but the BH type may be employed.

Followings are summarized aspects of the present invention.

(1) An optical module that allows a horizontal-cavity surface-emitting laser including, on a semiconductor substrate: a cavity structure that includes a multilayer structure obtained by stacking a first conductive-type cladding layer, an active layer for generating light, and a second conductive-type cladding layer in this order and that reflects or resonates light in the in-plane direction; a waveguide layer that is provided at at least a part of the semiconductor substrate to guide the light generated from the active layer; and a reflecting mirror that is provided at a part of the optical waveguide layer to emit laser light emitted from the cavity structure from the rear surface of the semiconductor substrate, wherein peripheral parts of the cavity structure and the reflecting-mirror are dug in a groove shape so as to have a depth reaching the first conductive-type cladding layer, a first electrode is provided on the first conductive-type cladding layer located at the bottom surface of the groove part, and a second electrode different from the first electrode is provided on the second conductive-type cladding layer so as to be positioned above the cavity structure on the same surface side as the first electrode, to be fitted, by using a supporting member and the groove part, onto an optical element mounting substrate having the supporting member shaped to be fitted into at least a part of the groove part at which the first electrode is provided, and to be mounted in a flip-chip manner so that the supporting member is brought into contact with at least a part of the first electrode.

(2) The optical module according to (1), wherein
the material of the supporting member is the same as that for bonding the element on the optical element substrate.

(3) The optical module according to (1), wherein
the material of the supporting member is a conductive material different from that for bonding the element on the optical element substrate.

(4) The optical module according to any one of (1) to (3), wherein
in the horizontal-cavity surface-emitting laser, the first electrode is formed only at one of the right and Left lateral parts of the reflecting mirror and the cavity structure.

(5) The optical module according to any one of (1) to (3), wherein
in the horizontal-cavity surface-emitting laser, the width of the first electrode at a lateral part of the reflecting mirror is different from that at a lateral part of the cavity.

(6) The optical module according to any one of (1) to (5), wherein
in the horizontal-cavity surface-emitting laser, the semiconductor substrate is formed using a semi-insulating semiconductor substrate.

(7) The optical module according to any one of (1) to (5), wherein
in the horizontal-cavity surface-emitting laser, the semiconductor substrate has a multilayer structure of a semi-insulating semiconductor layer and a conductive semiconductor layer, and the laser part is formed on the semi-insulating layer.

(8) The optical module according to (6) or (7), wherein
at least two horizontal-cavity surface-emitting lasers according to (6) or (7) are formed and arranged on the same semiconductor substrate and an electricity separation groove with a depth reaching the semi-insulating semiconductor layer is formed between the elements.

(9) The optical module according to any one of (1) to (8), wherein
in the horizontal-cavity surface-emitting laser, an integrated lens formed by processing the substrate is formed on a light emitting surface of the rear surface of the semiconductor substrate.

(10) The optical module according to (8), wherein
the width of the horizontal-cavity surface-emitting laser is 250 μm.

REFERENCE SIGNS LIST

1 . . . n-type InP substrate
2 . . . InGaAsP active layer
3, 83 . . . diffraction grating
4 . . . p-type InP clad
5, 13, 24, 25, 64, 74, 2009, 4004, 4011 . . . p-type electrode
6, 27, 66, 67, 76, 77, 2010, 4007, 4012 . . . n-type electrode
26, 65, 75, 4006 . . . n-electrode pad
68 . . . dummy pad
7 . . . InP window part
8, 14, 29, 69, 78, 100, 4009 . . . reflecting mirror
9 . . . light emitting surface
10 . . . gold wire
11 . . . laser sub-mount
12 . . . $SiO_2$ insulating film
15 . . . extracting pad
20, 60, 70, 80, 2011, 4000 . . . semi-insulating semiconductor substrate
21, 61, 71, 81, 2012, 4001 . . . n-type semiconductor layer
22, 62, 72, 82, 2013, 4002 . . . active layer
23, 63, 73, 84, 4003 . . . p-type semiconductor layer
28, 4008 . . . electricity separation groove
30, 4010 . . . integrated lens
85 . . . contact layer
86 . . . silicon oxide
31, 87, 2015 . . . buried semi-insulating layer
89, 2006, 4013 . . . dug groove
90 . . . silicon nitride mask
91 . . . column-like part
92 . . . nonreflecting film
93 . . . lens
101 . . . p-type electrode
102 . . . n-type electrode
1001 . . . stem
1002 . . . lead pin
1003, 2005 . . . light emitting element
1004 . . . light receiving element
1005 . . . package lens
1006 . . . ferrule
1007 . . . cap
1008, 2000, 3000, 4017 . . . optical element mounting substrate
1009 . . . optical fiber 2004 . . . supporting part member for fitting
2001, 2002, 2007, 2008, 3001, 3002, 4015, 4016 . . . electric line
2014, 4014 . . . solder
3003 . . . array-type light emitting element
25, 4005 . . . p-type electrode pad

The invention claimed is:

1. A horizontal-cavity surface-emitting laser comprising, on a semiconductor substrate:
   a cavity structure that includes a multilayer structure obtained by stacking a first conductive-type cladding layer, an active layer for generating light, and a second conductive-type cladding layer in this order and that reflects or resonates light in the in-plane direction;
   a waveguide layer that is constructed in the cavity structure and has extended regions on the semiconductor substrate to guide the light generated from the active layer; and
   a reflecting part that is constructed at one end of the waveguide layer and changes the light path of laser light emitted from the cavity structure to emit the laser light from the rear surface of the semiconductor substrate, wherein
   a first electrode constructed on the semiconductor substrate around a side region of the cavity structure and the reflecting part, and a second electrode constructed on the main surface of the cavity structure, are provided,
   the first electrode includes a first portion that is constructed along one side region of the reflecting part located in the perpendicular direction to the traveling direction of light guided through the waveguide layer, and a second portion that is constructed along one side region of the cavity structure and the other side region of the reflecting part that are located in the direction parallel to the traveling direction of light guided through the waveguide layer,
   the shape of the second portion of the first electrode is formed using a rectangle having a first short side provided around a side region of the reflecting part, and a rectangle having a second short side provided around a side region of the cavity structure, and
   the width of the first short side and the width of the second short side are different from each other.

2. The horizontal-cavity surface-emitting laser according to claim 1, wherein
   the width of the first short side is shorter than that of the second short side.

3. The horizontal-cavity surface-emitting laser according to claim 2, wherein
   the width of one side of the element is 250 μm.

4. The horizontal-cavity surface-emitting laser according to claim 1, wherein
   the semiconductor substrate is formed using a semi-insulating semiconductor layer.

5. The horizontal-cavity surface-emitting laser according to claim 1, wherein
   the semiconductor substrate has a multilayer structure of a semi-insulating semiconductor layer and a conductive semiconductor layer, and the cavity structure is formed on the semi-insulating semiconductor layer.

6. The horizontal-cavity surface-emitting laser according to claim 5, wherein
   the width of one side of the element is 250 μm.

7. The horizontal-cavity surface-emitting laser according to claim 1, wherein
   an integrated lens formed by processing the semiconductor substrate is provided on a light emitting surface of the rear surface of the semiconductor substrate.

8. A horizontal-cavity surface-emitting laser, wherein
   at least two horizontal-cavity surface-emitting lasers according to claim 1 are provided and arranged on the same semiconductor substrate, and an electricity separation groove with a depth reaching the semi-insulating semiconductor layer is formed between the elements.

9. A horizontal-cavity surface-emitting laser, wherein
   at least two horizontal-cavity surface-emitting lasers according to claim 1 are provided and arranged on the same semiconductor substrate, and an electricity separation groove with a depth reaching the semi-insulating semiconductor layer is formed between the elements.

* * * * *